United States Patent
Chen et al.

(10) Patent No.: US 9,472,599 B2
(45) Date of Patent: Oct. 18, 2016

(54) LIGHT EMITTING DEVICE

(71) Applicant: INDUSTRIAL TECHNOLOGY RESEARCH INSTITUTE, Hsinchu (TW)

(72) Inventors: Cheng-Chang Chen, Taichung (TW); Yi-Ping Lin, Hsinchu (TW); Cheng-Hung Li, Taoyuan County (TW); Jung-Yu Li, Zhubei (TW); Shih-Pu Chen, Hsinchu (TW); Jin-Han Wu, Kaohsiung (TW); Guan-Yu Chen, Nantou County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/884,553

(22) Filed: Oct. 15, 2015

(65) Prior Publication Data

US 2016/0035798 A1  Feb. 4, 2016

Related U.S. Application Data

(62) Division of application No. 14/144,080, filed on Dec. 30, 2013, now abandoned.

(30) Foreign Application Priority Data

Dec. 6, 2013 (TW) .............................. 102144912 A

(51) Int. Cl.
*H01L 51/00* (2006.01)
*H01L 29/08* (2006.01)
(Continued)

(52) U.S. Cl.
CPC ....... *H01L 27/3206* (2013.01); *H01L 27/3209* (2013.01); *H01L 33/40* (2013.01); *H01L 33/50* (2013.01); *H01L 51/5036* (2013.01); *H01L 51/5206* (2013.01); *H01L 51/5221* (2013.01);
(Continued)

(58) Field of Classification Search
CPC .............. H01L 27/3206; H01L 33/50; H01L 51/5206; H01L 27/3209; H01L 33/40; H01L 51/5221; H01L 51/5036; H01L 51/5262; H01L 2251/558; H01L 2251/301; H01L 51/52
See application file for complete search history.

(56) References Cited

U.S. PATENT DOCUMENTS

| 7,719,182 B2 | 5/2010 | Cok et al. |
| 2007/0164277 A1* | 7/2007 | Sung .................. H01L 27/3267 257/40 |
| 2007/0221912 A1* | 9/2007 | Jeong .................. H01L 51/0072 257/40 |

(Continued)

FOREIGN PATENT DOCUMENTS

| TW | 200414825 | 8/2004 |
| TW | 200721884 | 6/2007 |

OTHER PUBLICATIONS

Intellectual Property Office, Ministry of Economic Affairs, R.O.C., "Office Action", Aug. 18, 2015, Taiwan.

*Primary Examiner* — Victor A Mandala
(74) *Attorney, Agent, or Firm* — Locke Lord LLP; Tim Tingkang Xia, Esq.

(57) ABSTRACT

A light emitting device includes a substrate, a coupling unit and an organic light emitting unit. The coupling unit includes a first conductive layer, a first light emitting layer and a second conductive layer. The first conductive layer is located on the substrate. The first light emitting layer is located between the first conductive layer and the second conductive layer. The organic light emitting unit is located adjacent to the second conductive layer.

14 Claims, 7 Drawing Sheets

(51) Int. Cl.
*H01L 35/24* (2006.01)
*H01L 27/32* (2006.01)
*H01L 51/50* (2006.01)
*H01L 51/52* (2006.01)
*H01L 33/40* (2010.01)
*H01L 33/50* (2010.01)

(52) U.S. Cl.
CPC ..... *H01L 51/5262* (2013.01); *H01L 2251/301* (2013.01); *H01L 2251/558* (2013.01)

(56) References Cited

U.S. PATENT DOCUMENTS

| | | | |
|---|---|---|---|
| 2008/0074356 A1* | 3/2008 | Cok | G09G 3/3233 345/76 |
| 2012/0049723 A1* | 3/2012 | Lee | H01L 25/048 313/498 |
| 2013/0181194 A1* | 7/2013 | Lee | H01L 51/5044 257/40 |
| 2013/0187131 A1* | 7/2013 | Chung | H01L 27/326 257/40 |

* cited by examiner

LIGHT EMITTING DEVICE

CROSS-REFERENCE TO RELATED APPLICATIONS

This patent application is a divisional patent application of U.S. patent application Ser. No. 14/144,080 filed on Dec. 30, 2013 and entitled "LIGHT EMITTING DEVICE," which is a non-provisional application claims priority under 35 U.S.C. §119(a) on Patent Application No(s). 102144912 filed in Taiwan, R.O.C. on Dec. 6, 2013, the entire contents of which are hereby incorporated by reference.

TECHNICAL FIELD

The disclosure relates to a light emitting device.

BACKGROUND

Compared to conventional light emitting diode (LED), an organic light emitting diode (OLED), a point source of light, may emit soft light which is similar to the characteristic of plane light source. The OLED can be manufactured into large area and to be transparent and made with a soft substrate to be flexible. Also, its luminance and color temperature may be adjusted. Moreover, it can be manufactured by printing to greatly reduce the manufacturing cost. Thus, the OLED has been widely developed.

However, it is an important issue to increase the efficiency of the OLED so far. The major research fields are divided into two aspects: increasing the efficiency of inner quantum and enhancing the efficiency of light extraction of lighting unite. Increasing the efficiency of inner quantum is subject to enhancement of speed rate of spontaneity radiation by electron and hole pairs. Current research proves that by adjusting the mode spatial distribution of electromagnetic wave according to Purcell effect by the electron and hole pairs, the speed rate of spontaneity radiation may be increased. In recent years, other research indicates that smaller mode volume can be generated by applying surface plasmon mode to enhance the Purcell effect. Furthermore, another experiment proves that the coupling reaction between the electron and hole pairs and surface plasmon mode with high density of states (DOS) can enhance the intensity of photoluminescence.

SUMMARY

An embodiment of the disclosure provides a light emitting device comprising a substrate, a coupling unit and an organic light emitting unit. The coupling unit comprises a first conductive layer, a first light emitting layer and a second conductive layer. The first conductive layer is located on the substrate. The first light emitting layer is located between the first conductive layer and the second conductive layer. The organic light emitting unit is located adjacent to the second conductive layer.

BRIEF DESCRIPTION OF THE DRAWINGS

The present disclosure will become more fully understood from the detailed description given hereinbelow, along with the accompanying drawings which are for illustration only, thus are not limitative of the present disclosure, and wherein.

DETAILED DESCRIPTION

Figure 1:
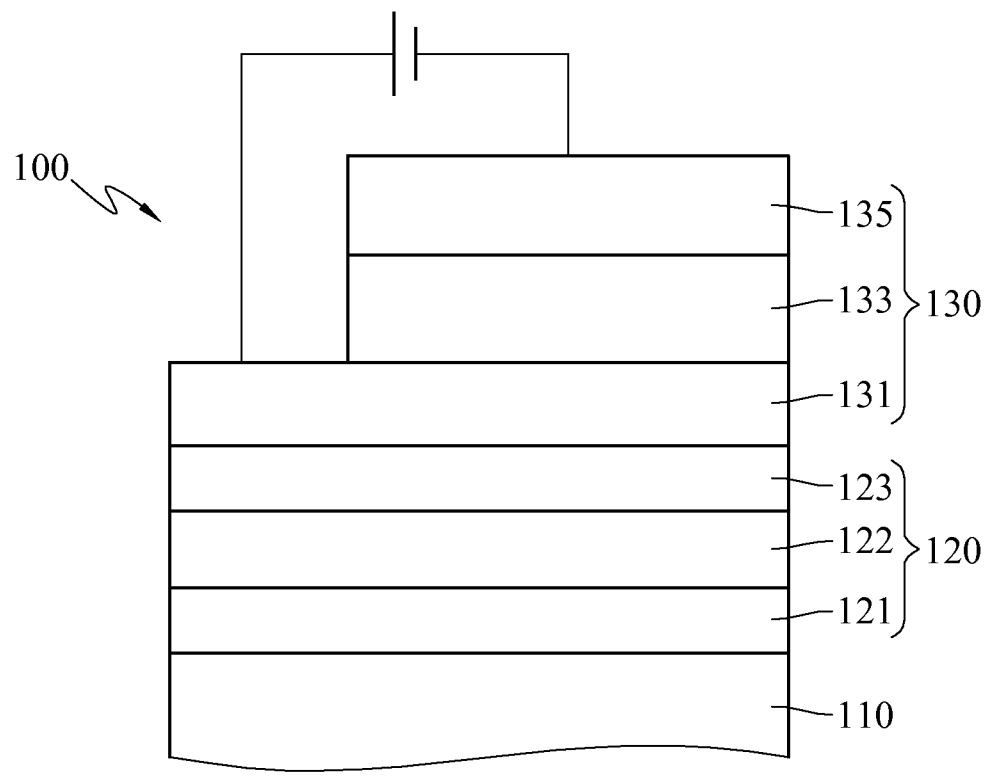
FIG. 1 is a schematic view of a light emitting device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a schematic view of a light emitting device according to an embodiment of the disclosure. According to one embodiment of the disclosure, the light emitting device 100 comprises, in order from bottom to top, a substrate 110, a coupling unit 120 and an organic light emitting unit 130. The coupling unit 120 comprises, in order from bottom to top, a first conductive layer 121, a first light emitting layer 122 and a second conductive layer 123. The organic light emitting unit 130 comprises, in order from bottom to top, a first electrode layer 131, a second light emitting layer 133 and a second electrode layer 135.

According to one embodiment of the disclosure, the organic light emitting unit 130 further comprises an electron transmission layer (not shown in the figure) disposed between the second electrode layer 135 and the second light emitting layer 133, and a hole transmission layer disposed between the second light emitting layer 133 and the first electrode layer 131 (not shown in the figure).

According to one embodiment of the disclosure, the substrate 110 is transparent, and the material of the substrate 110 is glass substrate or plastic substrate, but the material is not limited to the disclosure.

Figure 2:
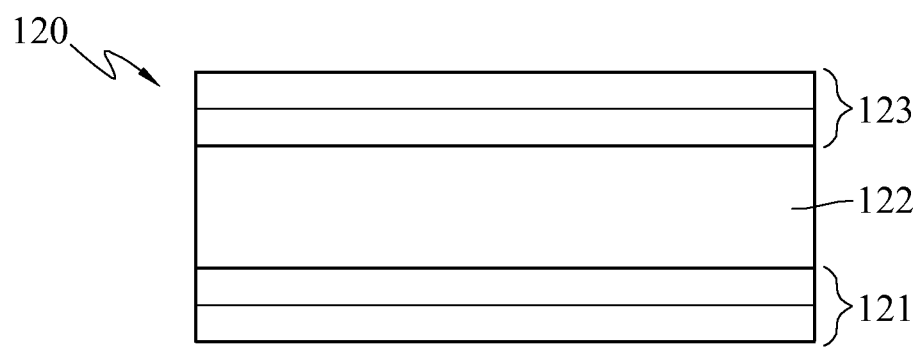
FIG. 2 is a schematic view of a coupling unit according to one embodiment of the disclosure.

According to one embodiment of the disclosure, please refer to FIG. 1, the coupling unit 120 comprises a first conductive layer 121, a second conductive layer 123 and a first light emitting layer 122. The first light emitting layer 122 is disposed between the first conductive layer 121 and the second conductive layer 123. The first conductive layer 121 is disposed on the substrate 110. In one embodiment, the first conductive layer 121 and the second conductive layer 123 both comprise a single-layered or a multiple-layered conductive layer. For example, the material of the single-layered conductive layer is selected from a group consisting of gold, silver, aluminum, platinum, zinc, nickel, copper and combinations thereof. The material of the single-layered conductive layer is a metal wire, the material of the metal wire is selected from a group consisting of gold, silver, aluminum, platinum, zinc, nickel, copper and combinations (i.e., alloy) thereof. Alternatively, the material of the above-mentioned single-layered conductive layer is formed by a micrometer-scale or nanometer-scale metal wire. In the above-mentioned embodiments, the first conductive layer 121 and the second conductive layer 123 is a metal conductive layer which the thickness is 3 nanometers (nm) to 30 nm. Please refer to FIG. 2, which is a schematic view of a coupling unit according to one embodiment of the disclosure. According to another embodiment of the disclosure, each first conductive layer 121 and second conductive layer 123 of the coupling unit 120 comprises a double-layered conductive layer which is composed of a metal thin film layer and a metal oxide thin film layer. For example, the first conductive layer 121 and/or the second conductive layer 123 is the double-layered conductive layer composed of a metal layer whose material is selected from a group consisting of gold, silver, aluminum, platinum, zinc, nickel, copper and combinations thereof and a thin-film layer which is a metal oxide selected from a group consisting of gold, silver, aluminum, platinum, zinc, nickel, copper and combinations thereof. In one embodiment, the material of the first conductive layer 121 and that of the second conductive layer 123 are the same.

Figure 3:
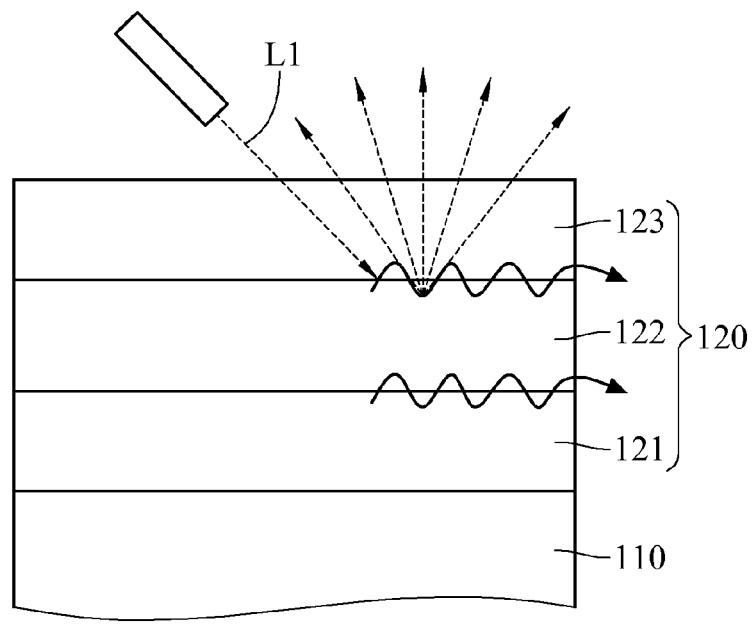
FIG. 3 is a schematic view of two metal interfaces of the coupling unit performing a surface plasmon coupling according to an embodiment of the disclosure.

Please refer to FIG. 3, which is a schematic view of two metal interfaces of the coupling unit performing a surface plasmon coupling according to an embodiment of the disclosure. In the coupling unit 120 which is called Metal/Dielectric/Metal structure (MDM structure), the first light emitting layer 122 comprises a light emitting layer with a first light emitting wavelength. The material of the above-mentioned first light emitting layer 122 is organic light emitting material, non-organic light emitting material or combinations thereof. In one embodiment, the thickness of the first light emitting layer 122 is 50 nm to 250 nm. For example, when the material of the first light emitting layer 122 is organic light emitting material, the organic light emitting layer comprises an electroluminescence or photoluminescence organic light emitting layer. When the thickness of the organic light emitting material, i.e. 50 nm to 250 nm, is less than the transmittance depth of surface plasmon on single surface of the MDM structure, the surface plasmons may be coupled at the interfaces between the organic light emitting layers and the conductive layer, which may regenerate highly adjustable coupling surface plasmon wave of odd function. Thus, it may assure the surface plasmons between two surfaces are mightily coupled, and the surface plasmon mode is tightly limited between the first conductive layer and the second conductive layer to enhance the interaction between the inner electron and hole pairs and the surface plasmons. In another embodiment, when the material of the first light emitting layer 122 is non-organic light emitting material, the non-organic light emitting material comprises quantum dots or phosphor material. For example, the thickness of the non-organic light emitting material is 50 nm to 250 nm. The non-organic light emitting material may generate the coupling of surface plasmons. In this embodiment, the light emitting spectrum of the first light emitting layer 122 is a continuous spectrum. In other words, the light wave emitted by the first light emitting layer 122 covers a range of wavelength. The first light emitting wavelength emitted by the first light emitting layer represents the wavelength of the light with the greatest intensity among all light emitted by the light emitting material.

According to one embodiment of the disclosure, the organic light emitting unit 130, shown in FIG. 1, comprises a first electrode layer 131, a second electrode layer 135 and a second light emitting layer 133 disposed between the first electrode layer 131 and the second electrode layer 135. In one embodiment, the first electrode layer 131 is transparent and comprises indium tin oxide (ITO). For example, the second electrode layer 135 is a conductible metal. The second light emitting layer 133 comprises a single-layered or a multiple-layered light emitting layer. For example, when the second light emitting layer 133 is a single-layered light emitting layer, the single-layered light emitting layer comprises a light emitting layer with a second light emitting wavelength. In this embodiment, the spectrum emitted by the light emitting layer is a continuous spectrum. In other words, the light wave emitted by the second light emitting layer 133 covers a range of wavelength. The second light emitting wavelength emitted by the second light emitting layer represents the wavelength of the light with the greatest intensity among all light emitted by the light emitting material.

In one embodiment, the second light emitting wavelength of the light emitted by the second light emitting layer 133 is less than the first light emitting wavelength of the light emitted by the first light emitting layer 122 of the coupling unit 120.

Figure 4:
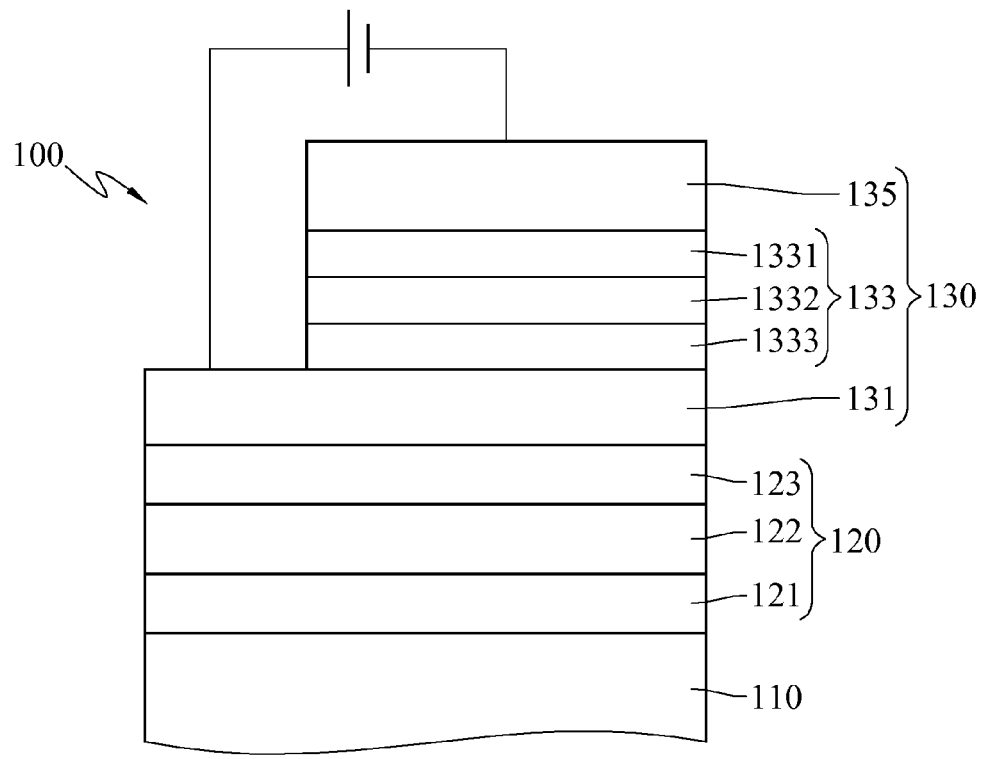
FIG. 4 is a schematic view of a light emitting device with three light emitting layers according to an embodiment of the disclosure.

According to one embodiment of the disclosure, a light emitting device including multiple light emitting layers is disclosed. The same numerals in FIG. 1 and this embodiment represent the same structures. The second light emitting layer 133 comprises a multiple-layered light emitting layer, for example, the number of the light emitting layers is three. Please refer to FIG. 4, which is a schematic view of a light emitting device with three light emitting layers according to an embodiment of the disclosure. The second light emitting layer 133 comprises, in order from bottom to top, a first sub light emitting layer 1331 with a third light emitting wavelength, a second sub light emitting layer 1332 with a fourth light emitting wavelength and a third sub light emitting layer 1333 with a fifth light emitting wavelength. In this embodiment, each spectrum of the light emitting layers is a continuous spectrum, that is, the light covers a range of wavelength. The three-layered light emitting layer emits the third, fourth and fifth light emitting wavelengths, which each is the wavelength of the light having the greatest intensity among all light emitted from each light emitting layer. In one embodiment, the third, fourth and fifth light emitting wavelengths are all less than the first wavelength emitted by the first light emitting layer 122 of the coupling unit 120. In one embodiment, the thickness of the second light emitting layer 133 is 50 to 2000 nm, but the disclosure is not limited thereto. In other embodiments, the thickness of the second light emitting layer 133 is 50 nm to 300 nm.

Figure 5:
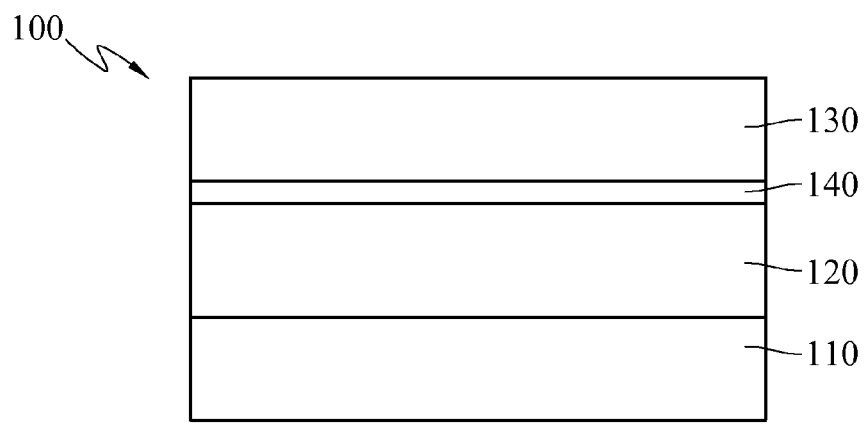
FIG. 5 is a schematic view of a light emitting device according to an embodiment of the disclosure.

Please refer to FIG. 5, which is a schematic view of a light emitting device according to an embodiment of the disclosure. According to one embodiment of the disclosure, the light emitting device 100 further comprises a transparent and insulated layer 140 disposed between the coupling unit 120 and the organic light emitting unit 130. In one embodiment, the material of the transparent and insulated layer is an insulation material, i.e., silicon dioxide or silicon nitride, and the thickness is 10 nm to 30 nm.

In order to better understanding the above-mentioned and other purposes, features and advantages of the disclosure, the following provides exemplary embodiments to describe the light emitting device of the disclosure.

The Fabrication of the Coupling Unit 120

Embodiment 1

Figure 6:
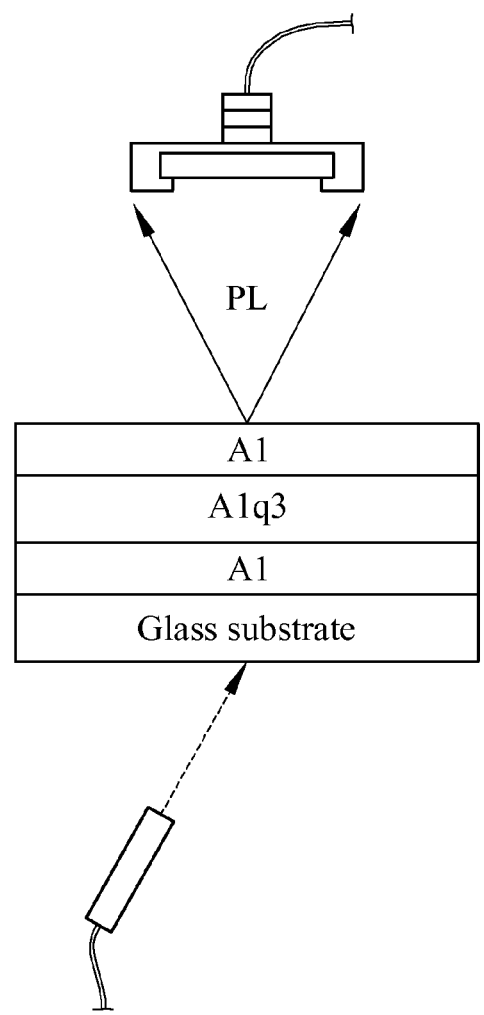
FIG. 6 is a schematic view of measuring surface plasmon resonance according to an embodiment of the disclosure.

A glass substrate is provided. An aluminum metal with thickness of 20 nm is deposited on the glass substrate by thermally evaporation before Alq$_3$ organic light emitting material with thickness 130 nm is thermally sputtered on it at 180 degrees Celsius. Then, another aluminum metal with thickness 20 nm is deposited on the Alq$_3$ organic light-emitting material. However, these materials do not limit the disclosure, and the actual application is based on the claims of the disclosure. A semiconductor laser device with continuous wavelength of 405 nm or pulse pattern is applied to the phosphor photoluminescence, and light with a fixed incident angle is emitted to excite the Phosphor. Please refer to FIG. 6, which is a schematic view of measuring surface plasmon resonance according to an embodiment of the disclosure, the excited phosphor enters a single wavelength spectrometer after being concentrated by a lens at the front surface of the test sample to obtain the spectrum of the phosphor.

Test of Surface Plasmon Resonance of the Coupling Unit 120

Figure 7:
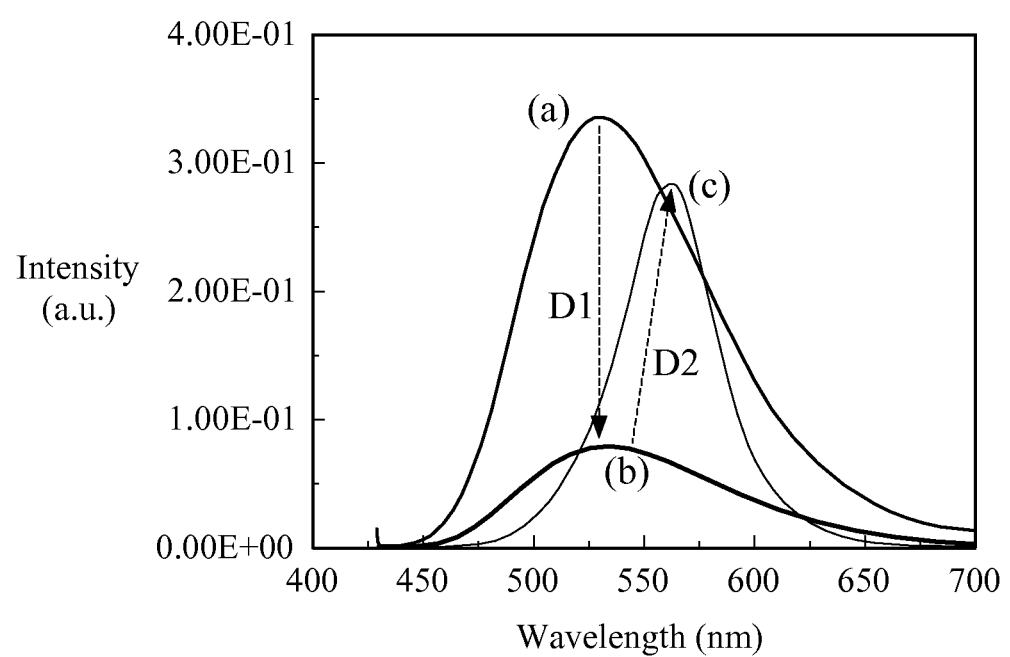
FIG. 7 is a graph of a result of measuring photoluminescence of groups of comparative structures according to an embodiment of the disclosure.

Structure (a) is Alq$_3$ organic light emitting material/glass structure without metal; Structure (b) is single layer metal aluminum/Alq$_3$ organic light emitting layer/glass structure (e.g., MD structure); Structure (c) is single layer aluminum metal/Alq$_3$ organic light emitting layer/single layer aluminum metal (e.g., MDM structure). The requirement of the fabrication is the same as embodiment 1. Then, the above three structures are excited by the phosphor photoluminescence with the wavelength of 405 nm. The result shows in FIG. 7, which is a graph of a result of measuring photoluminescence of groups of comparative structures according to an embodiment of the disclosure. The result finds out that the intensity of photoluminescence (PL) spectrum of Structure (a) without metal is the highest. After a single-layer metal is added, the intensity of the PL spectrum of structure (b) is obviously reduced, which is far lower than the intensity of the pure light emitting material. After double metals coupling unit is added, the intensity of the PL spectrum is obviously enhanced, and the peak of the spectrum is red shifted to move 35 nm. Also, the width of half height of the spectrum is 30 nm, which is narrower such that the energy of the light is much more concentrated. Compare structure (b) with structure (c) and calculate the integrated area of the spectrum. The optical gain of the structure (c) is 1.85 times that of the structure (b). This test is different form the conventional understanding, that is, a special interaction is generated between photons of the phosphor and the surface plasmon resonance.

According to the above description, it may be assumed that the intensity of phosphor of single-metal-layered structure (b) is weakened because of energy loss of surface plasmon and the blocking of the metal layer. In order to further test and analyze the coupling unit and attributes of PL spectrum, variable angle of the PL spectrum is measured and polarized by trans-magnetic (TM). The variable angles, wavelengths of phosphor and the intensities of photoluminescence of each wavelength are all depicted on a three-dimensional vector grey scale view, the dispersion curves are compared based on the theory and experiment. Thus, it is proved that the phosphor of the coupling unit is indeed generated from the radiation emitted by radiant surface plasmon mode or other light mode inside the coupling unit. Alternatively, the comparison and analysis of the dispersion curves of the coupling unit and the theoretical structures are applied by sample transmittance or reflection spectrum measurement experiment.

Figure 8A:
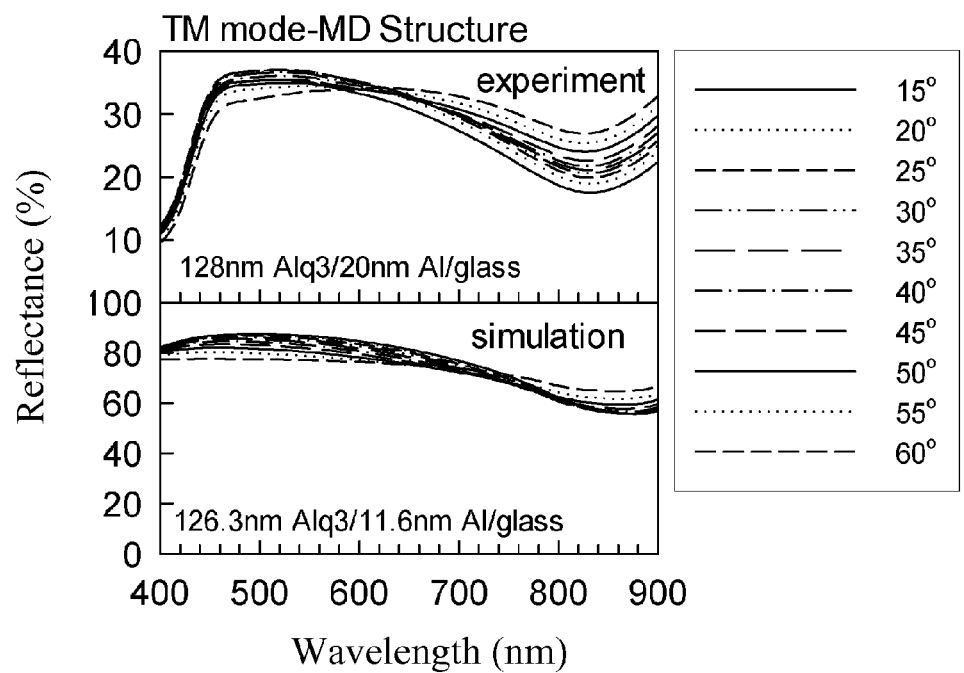
FIGS. 8A to 8D are graphs of results of measuring reflectance and transmittance of the structures of Al/organic light emitting material/Al and Al/organic light emitting material/glass according to an embodiment of the disclosure.
Figure 8B:
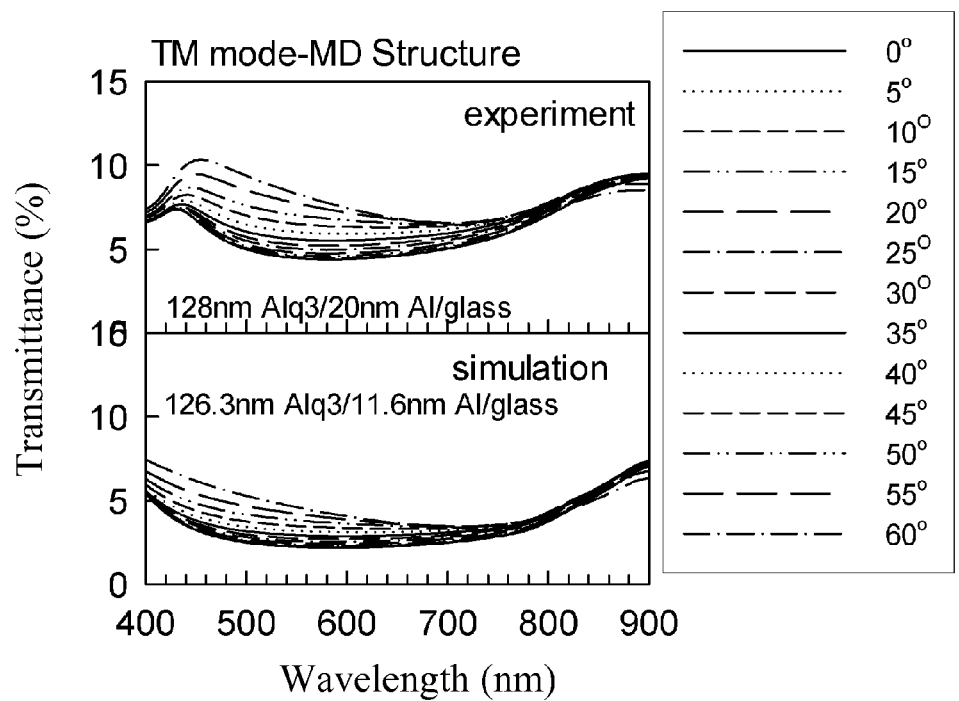
Figure 8C:
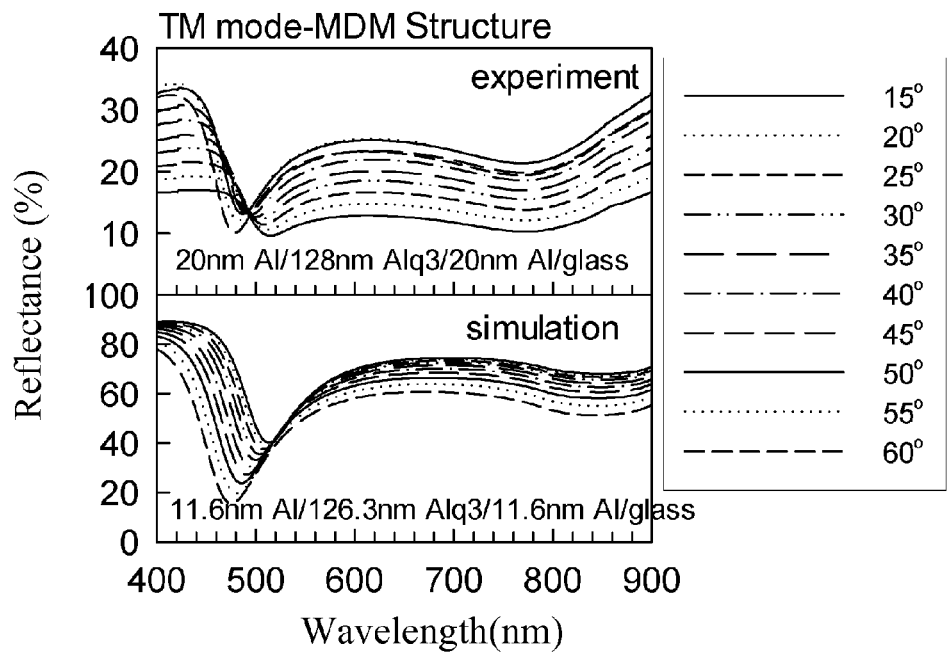
Figure 8D:
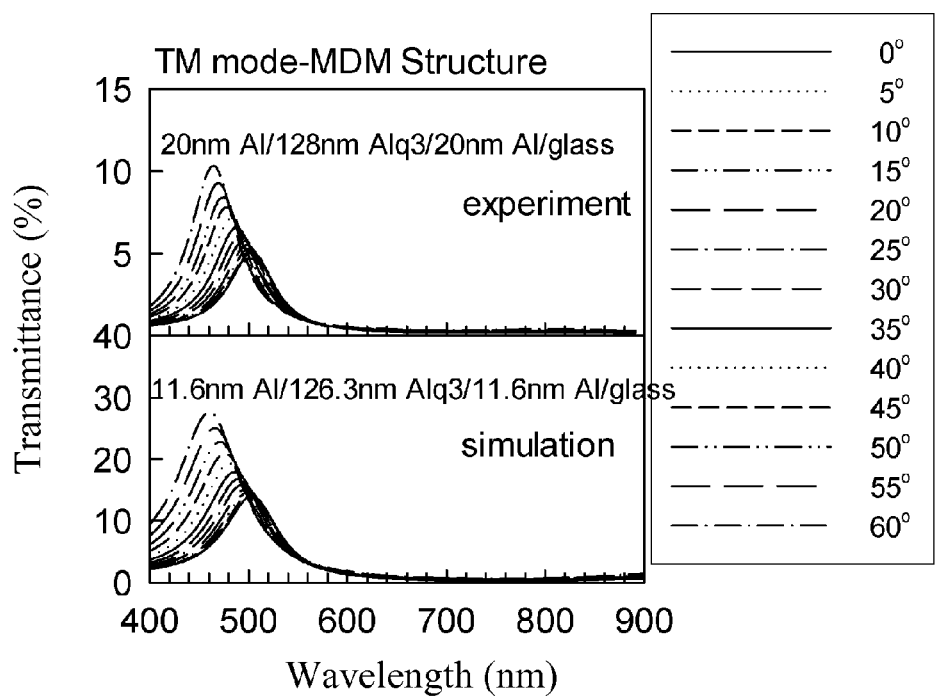

Please refer to FIGS. 8A to 8D, FIGS. 8A and 8B are diagrams showing the results of the reflection and transmittance of incident light of the experiment group and simulation group in TM mode of Al/organic light emitting material/glass (MD structure). FIGS. 8C and 8D are diagrams showing the results of the reflection and transmittance of incident light of the experiment group and simulation group in TM mode of Al/organic light emitting material/Al coupling unit (MDM structure). The condition of fabrication of the experiment group is similar to Embodiment 1. The difference is that the thickness of the organic light emitting material (Alq$_3$) in this embodiment is 128 nm, and the thickness of the organic light emitting material (Alq$_3$) in simulation group is 126.3 nm. In the MD structure, 450 to 400 nm in the wavebands are steeply dropped in the reflection spectrum (FIG. 8A) and the transmittance spectrum (FIG. 8B) in the experiment group is because that the light emitting material Alq$_3$ itself absorbs the waveband. Apparently, in the MDM structure (FIG. 8C), the reflection spectrum of the light emitting device has an obvious dip, and the incident angle is increased from 0 to 60 degrees. A blue shift is performed corresponding to the corresponding wavelength of the dip, which is moved from 525 nm to 475 nm. The experiment and theoretical curves are similar. The dip is due to the resonance effect generated by the incident light with certain angle and the surface plasmon wave, that is, the surface plasmon resonance. The energy of the incident light is shifted to the surface plasmon wave such that the reflected light is suddenly disappeared, and the reflectance is suddenly dropped. Moreover, the transmittance spectrum (FIG. 8D) shows that the surface plasmon mode generated by the excitation and resonance of the coupling unit has the characteristic of being radiative. The resonance wavelength of reflection and transmittance are slightly different, it is surmised that the actual sample absorbs the radiation.

The dispersion curves are calculated by the result of measurement of the reflection and transmittance of the coupling unit. Please refer to FIG. 9, which is a graph of dispersion curves of a theoretical sample (solid line) and an experiment sample (solid dot) of coupling units according to an embodiment of the disclosure. The figure shows the single interface surface plasmon is divided into an odd function and an even function surface plasmon mode. The lightline Alq$_3$ of dispersion curve of odd function mode enters the radiation zone at the left side of the lightline air, which means this part of surface plasmon mode of the odd function may be directly coupled to free-space photons with capable of being radiative. According to the reflection spectrum R %-dip and transmittance spectrum T %, the angles and wavelengths corresponding to the peak point are calculated by the equation:

$$k_x = \sqrt{\varepsilon_d}(\omega/c_0)\sin\theta$$

$$\omega = 1240/\lambda \text{ (eV)}$$

Figure 9:
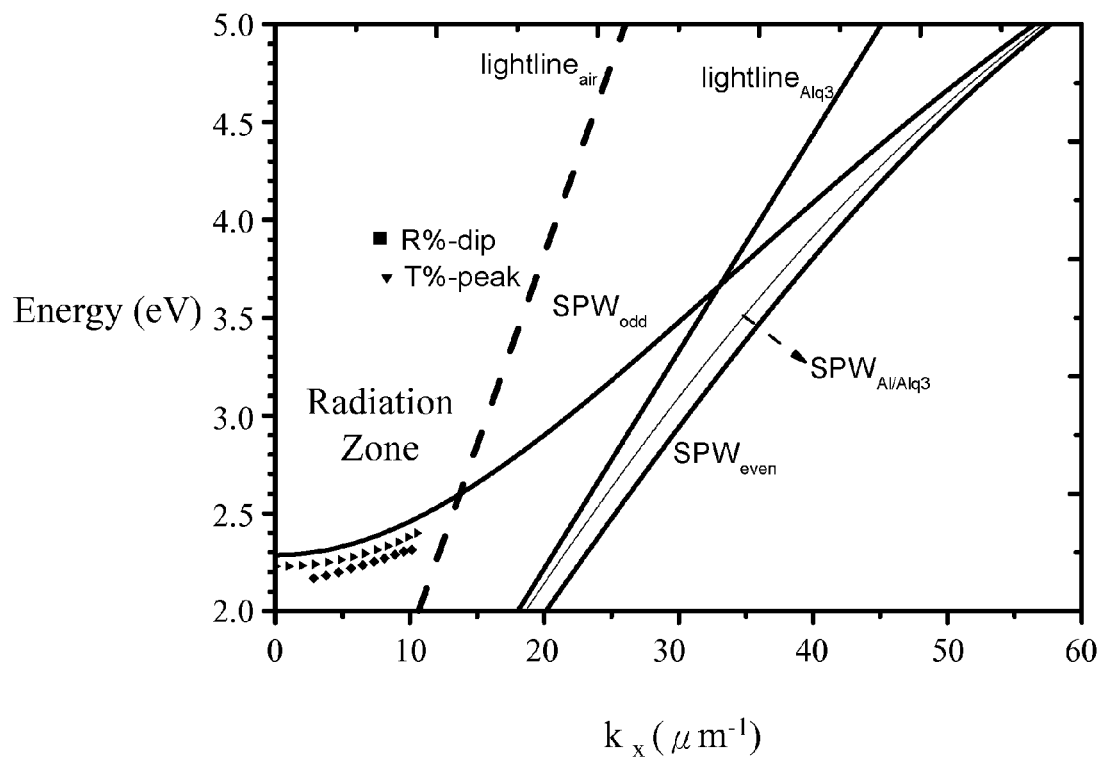
FIG. 9 is a graph of dispersion curves of a theoretical sample and an experimental sample of coupling units according to an embodiment of the disclosure.

After calculation, the points are depicted on the dispersion curves diagram. The diagram shows that the experiment points are indeed located in the radiation zone at left side of the lightline air and approach the theoretical curves of the odd function mode. The slight differentiation of the two curves is due to when the theoretical dispersion curve of the MDM structure is calculated, the thickness of the two layer metal is assumed to be semi-infinite for easily calculating the boundary condition. However, the actual condition is that the coupling unit has a limited thickness. The theoretical values of the dispersion curves in FIG. 9 are similar to the experimental values, and the wavelength of the peak of the coupling unit is much similar to the wavelength of the peak of the PL, which is 550 nm. The odd function surface plasmon mode of the coupling unit has a decisive impact on the attributes of the spontaneity radiation phosphor photoluminescence of the coupling unit. Also, it indirectly proves that when the electron and hole pairs of the light emitting layer of the coupling unit are spontaneously recombined, a major of surface plasmon polaritons (SPP) are generated but not general phosphor photon, which causes the wavelength of the peak value of the PL to mainly be equaled to the wavelength of the surface plasmon which has been excited and resonated. In the meantime, the narrower width of half height of the spectrum has a purity effect on the light emitting spectrum of the units. Moreover, the coupling unit enhances the intensity of the PL, and it also proves that the surface plasmon effect enhances the rate of spontaneity radiation by the electron and hole pairs and mainly becomes the SPP by radiation. Furthermore, because the coupling unit is capable of radiation, the intensity and efficiency of light emitting by the unit is enhanced.

The total thickness of non-metal in the coupling unit affects the characteristics of the surface plasmon. Thus, the thickness should be designed according to the characteristics of the surface plasmon and the thickness may not be greater than the wavelength of the spontaneity radiation on the structure. Moreover, taking the transmittance of the photon into consideration, the thicknesses of the upper and lower metal layers of the MDM structure may not be too thick, but the thicknesses are at least 3 to 30 nm, and the upper and lower metal layers are coated by evaporation, sputtering or plating.

Embodiments 2

The MDM structure is applied to an OLED unit. An insulation layer (silicon dioxide with 10 to 30 nm) is formed between the first electrode layer and the upper metal layer (second conductive layer) of the MDM structure. blue ray emitted by the OLED unit is applied to excite the light emitting layer of the MDM structure, such as yellow ray, to mix together to produce white ray, and the MDM structure is designed to gain a certain energy band. Please refer to Table 1, which is a reference of thicknesses of light emitting materials of MDM structure. The Table 1 shows that the wavelengths of the light emitting materials corresponding to the light emitting materials with different refractive index have appropriate thicknesses to improve optical gains.

TABLE 1

| Light emitting wavelength of OLED/refractive index of light emitting materials | 1.3 | 1.4 | 1.5 | 1.6 | 1.7 | 1.8 |
|---|---|---|---|---|---|---|
| Ultraviolet ray (360-400 nm) | 110 nm | 100 nm | 90 nm | 85 nm | 80 nm | 75 nm |
| Blue ray (430-460 nm) | 145 nm | 135 nm | 125 nm | 115 nm | 105 nm | 100 nm |
| Green ray (520-560 nm) | 175 nm | 160 nm | 150 nm | 140 nm | 130 nm | 125 nm |
| Red ray (630-660 nm) | 215 nm | 200 nm | 185 nm | 170 nm | 160 nm | 155 nm |

TABLE 1-continued

| Light emitting wavelength of OLED/refractive index of light emitting materials | 1.3 | 1.4 | 1.5 | 1.6 | 1.7 | 1.8 |
|---|---|---|---|---|---|---|
| Near infrared ray (800 nm) | 275 nm | 255 nm | 230 nm | 220 nm | 200 nm | 185 nm |

Adjusting the thickness of organic layer makes the greatest coupling of the surface plasmon match the light emitting wavelength of the organic material as well as further reducing the thickness of the conductive layer to enhance the optical gain effect.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

What is claimed is:

1. A light emitting device, comprising:
   a substrate;
   a coupling unit comprising a first conductive layer, a first light emitting layer and a second conductive layer, the first conductive layer located on the substrate, the first light emitting layer located between the first conductive layer and the second conductive layer, wherein the first light emitting layer directly contacts the first conductive layer and the second conductive layer;
   an organic light emitting unit, located adjacent to the second conductive layer, wherein the organic light emitting unit is configured for selectively emitting a first light and exciting the first light emitting layer to emit a second light, such that a surface plasmon resonance is induced by the second light on a surface between the first conductive layer and the first light emitting layer and on a surface between the second conductive layer and the first light emitting layer;
   wherein the organic light emitting unit comprises a first electrode layer, a second light emitting layer and a second electrode layer, the second light emitting layer is located between the first electrode layer and the second electrode layer, the second light emitting layer is configured for emitting the first light based on the voltage difference between the first electrode layer and the second electrode layer;
   wherein the first electrode layer is adjacent to the second conductive layer; and
   a transparent and insulated layer, located between the first electrode layer and the second conductive layer.

2. The light emitting device according to claim 1, wherein the first light has a second light emitting wavelength, the second light has a first light emitting wavelength, and the second light emitting wavelength is less than the first light emitting wavelength.

3. The light emitting device according to claim 1, wherein the organic light emitting unit further comprises an electron transmission layer and a hole transmission layer, wherein the electron transmission layer is located between the second electrode layer and the second light emitting layer, and the hole transmission layer is located between the second light emitting layer and the first electrode layer.

4. The light emitting device according to claim 1, wherein the second light emitting layer comprises an organic light emitting layer for emitting light excited by electron or luminance.

5. The light emitting device according to claim 1, wherein the thickness of the second light emitting layer is 50 nm to 2000 nm.

6. The light emitting device according to claim 1, wherein the first conductive layer or the second conductive layer comprises a single-layered or a double-layered conductive layer.

7. The light emitting device according to claim 6, wherein the first conductive layer or the second conductive layer comprises a double-layered conductive layer, and the doubled-layered conductive layer comprises a metal thin film and a metal oxidation film.

8. The light emitting device according to claim 6, wherein the material of the single-layered conductive layer is selected from a group consisting of gold, silver, aluminum, platinum, zinc, nickel, copper and combinations thereof.

9. The light emitting device according to claim 6, wherein the material of the single-layered conductive layer is a metal wire, the material of the metal wire is selected from a group consisting of gold, silver, aluminum, platinum, zinc, nickel, copper and combinations thereof.

10. The light emitting device according to claim 1, wherein the material of the first conductive layer is the same as that of the second conductive layer.

11. The light emitting device according to claim 1, wherein the material of the first light emitting layer includes organic light emitting material, non-organic light emitting material or combinations thereof.

12. The light emitting device according to claim 11, wherein the material of the first light emitting layer includes non-organic light emitting material, and the non-organic light emitting material includes quantum dots or phosphor material.

13. The light emitting device according to claim 1, wherein the thickness of the first conductive layer or the second conductive layer is in a range of 3 nm to 30 nm.

14. The light emitting device according to claim 1, wherein the thickness of the first light emitting layer is in a range of 50 nm to 250 nm.

* * * * *